(12) United States Patent
Uemura et al.

(10) Patent No.: US 8,770,795 B2
(45) Date of Patent: Jul. 8, 2014

(54) LIGHT-EMITTING DEVICE AND LIGHTING APPARATUS

(75) Inventors: Kozo Uemura, Yokosuka (JP); Soichi Shibusawa, Yokosuka (JP); Shuhei Matsuda, Yokosuka (JP); Nobuhiko Betsuda, Yokosuka (JP); Kiyoshi Nishimura, Yokosuka (JP); Masatoshi Kumagai, Yokosuka (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 463 days.

(21) Appl. No.: 13/236,672

(22) Filed: Sep. 20, 2011

(65) Prior Publication Data

US 2012/0075836 A1     Mar. 29, 2012

(30) Foreign Application Priority Data

Sep. 27, 2010   (JP) ................. 2010-214767

(51) Int. Cl.
*F21V 21/00*   (2006.01)

(52) U.S. Cl.
USPC ..... 362/249.06; 257/98; 313/500; 315/185 R; 362/237; 362/249.02

(58) Field of Classification Search
USPC .......... 257/98; 313/500; 315/185 R; 362/225, 362/237, 249.02, 249.06, 249.14, 800
See application file for complete search history.

(56) References Cited

U.S. PATENT DOCUMENTS

| 7,648,257 B2 * | 1/2010 | Villard | 362/249.02 |
| 2010/0302780 A1 * | 12/2010 | Liu | 362/249.06 |
| 2011/0175536 A1 | 7/2011 | Fujita | |

FOREIGN PATENT DOCUMENTS

| CN | 1847851 | 10/2006 |
| CN | 201028335 | 2/2008 |
| JP | 2001-351402 | 12/2001 |
| JP | 2007-059930 | 3/2007 |
| JP | 2009-054989 | 3/2009 |
| JP | 2000-266678 | 11/2009 |
| JP | 2010-135747 | 6/2010 |
| KR | 2009-0097521 | 9/2009 |
| WO | WO 2010/018682 | 2/2010 |

OTHER PUBLICATIONS

Chinese Office Action issued in CN 201110288534.5 on Aug. 19, 2013.
English Language Translation of Chinese Office Action issued in CN 201110288534.5 on Aug. 19, 2013.
English Language Abstract of JP 2009-266678 published Nov. 12, 2009.
English Language Translation of JP 2009-266678 published Nov. 12, 2009.

(Continued)

*Primary Examiner* — Stephen F Husar
(74) *Attorney, Agent, or Firm* — DLA Piper LLP (US)

(57) ABSTRACT

A light-emitting device includes a substrate, and a plurality of light-emitting elements mounted on the substrate. The light-emitting elements are placed to meet conditions that the number B of light-emitting elements per unit area ($cm^2$) of a mounting part is not less than 0.4 and a mean mounting density D is not less than 58 to not greater than 334, when a relationship of formula "$D=A \times B$" is established, assuming D as a mean mounting density of light-emitting elements on a substrate, A as a current (mA) flowing through one light-emitting element, and B as the number of light-emitting elements per unit area ($cm^2$) of a substantial mounting part for light-emitting elements.

11 Claims, 13 Drawing Sheets

(56) References Cited

OTHER PUBLICATIONS

English Language Abstract of CN 1847951 published on Oct. 18, 2006.
English Language Abstract of CN 201028335 published Feb. 27, 2008.
English Language Abstract of KR 2009-0097521 published on Sep. 16, 2009.
European Search Report issued in EP 11182037.9 on Nov. 9, 2012.
English Language Abstract of JP 2009-054989 published Mar. 12, 2009.
English Language Translation of JP 2009-054989 published Mar. 12, 2009.
English Language Abstract of JP 2001-351402 published Dec. 21, 2001.
English Language Translation of JP 2001-351402 published Dec. 21, 2001.
Japanese Office Action issued in JP 2010/214767 on Dec. 3, 2013.
English Language Translation of Japanese Office Action issued in JP 2010/214767 on Dec. 3, 2013.
English Language Abstract and Translation of JP 2007-059930 published on Mar. 8, 2007.
English Language Abstract and Translation of JP 2010-135747 published on Jun. 17, 2010.

\* cited by examiner

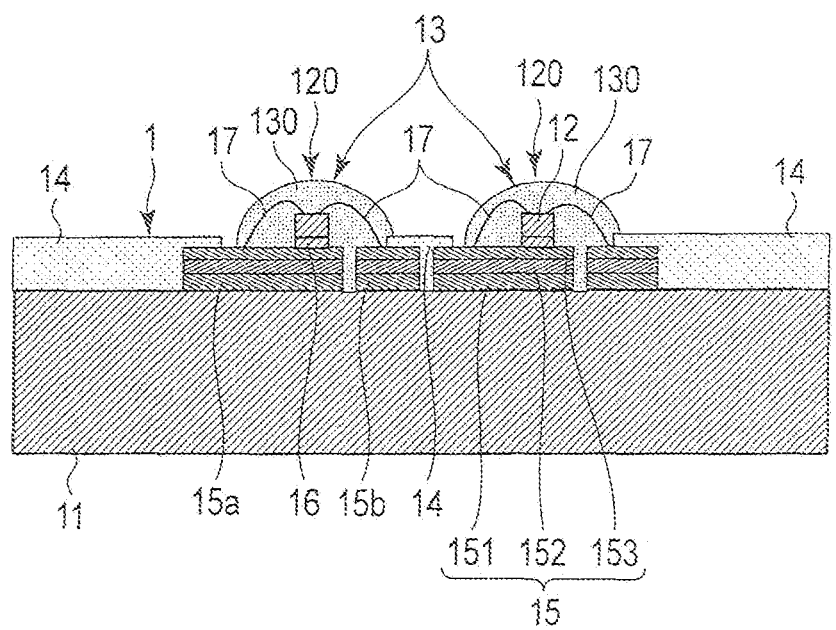
F I G. 2
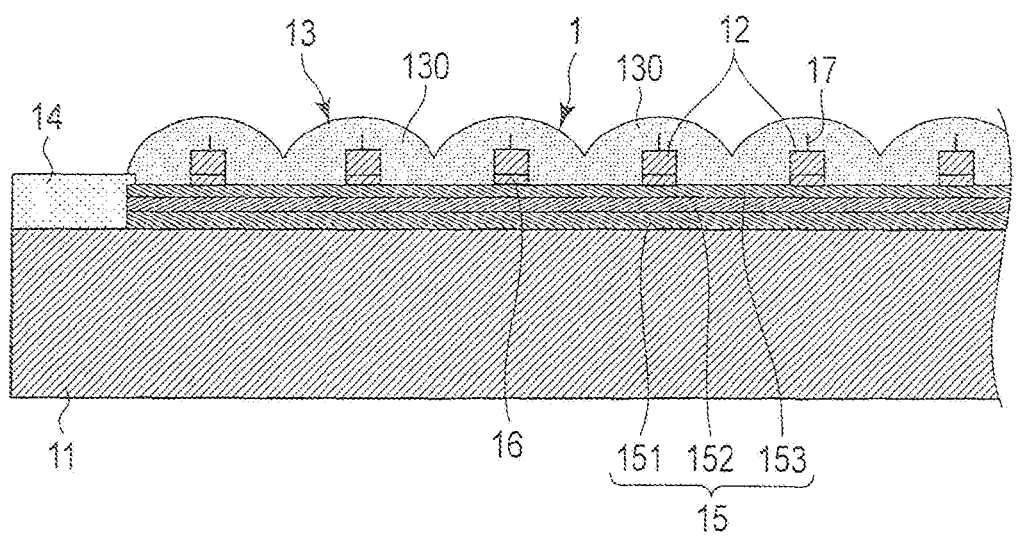
F I G. 3

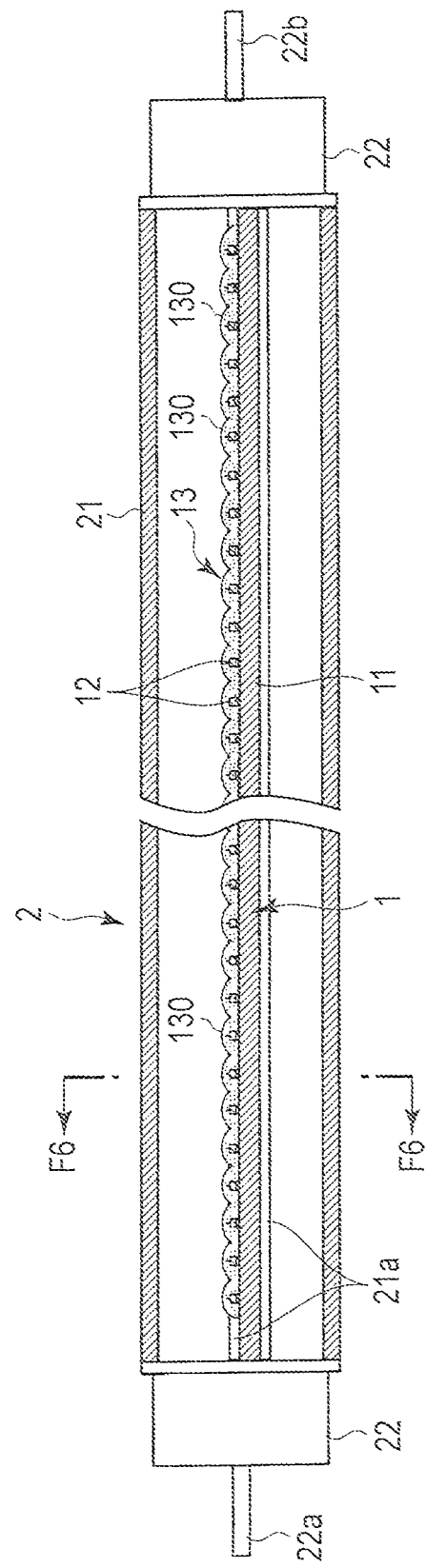
F I G. 5

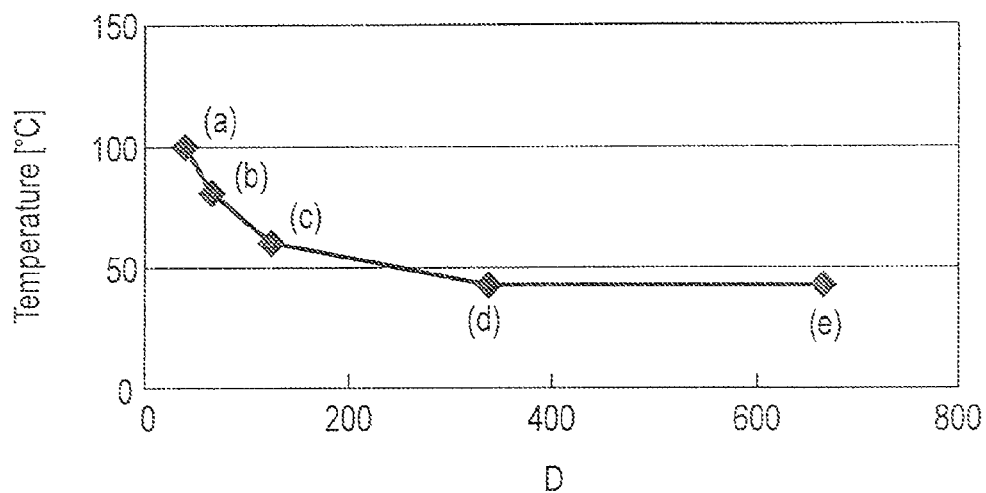
F I G. 15
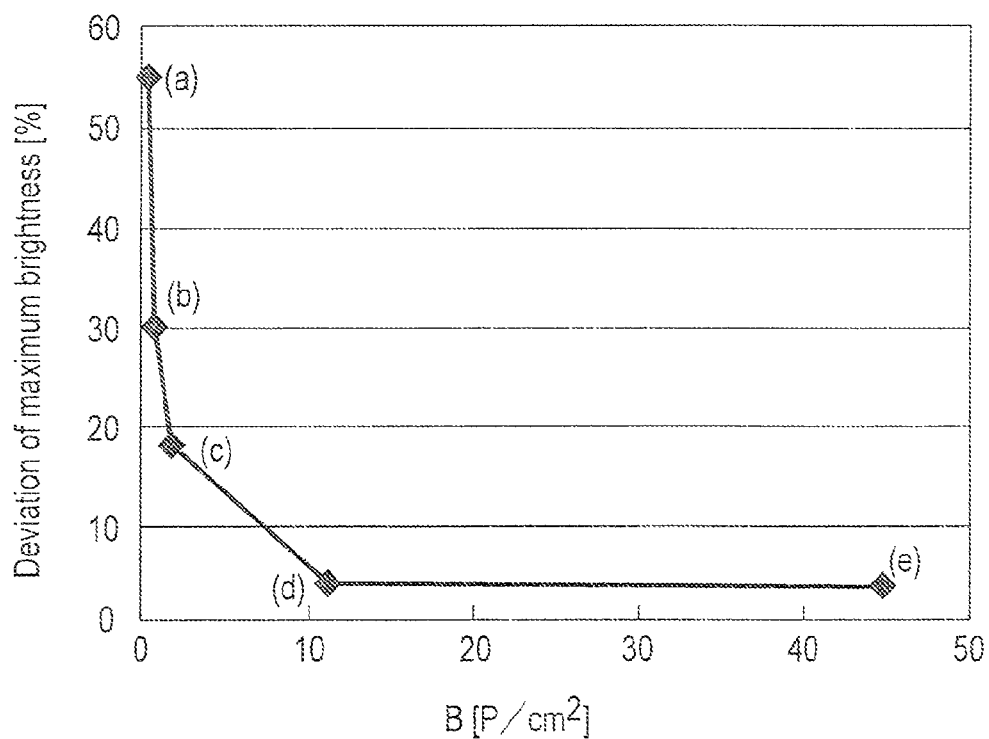
F I G. 16

US 8,770,795 B2

LIGHT-EMITTING DEVICE AND LIGHTING APPARATUS

CROSS-REFERENCE TO RELATED APPLICATIONS

This application is based upon and claims the benefit of priority from prior Japanese Patent Application No. 2010-214767, filed Sep. 27, 2010, the entire contents of which are incorporated herein by reference.

FIELD

Embodiments described herein relate generally to a light-emitting device, which is using a light-emitting element such as a light-emitting diode (LED), and a luminaire.

BACKGROUND

A light-emitting diode (LED) has been used as a light source as result of improvement in output and light-emitting efficiency, and becoming popular. A lighting apparatus using an LED has been developed as a luminaire used indoor or outdoor. In such a luminaire, a plurality of light-emitting elements such as LEDS is directly mounted on a substrate, and each light-emitting element is sealed by being covered with a fluorescent layer as a sealing resin layer containing a fluorescent material.

In this case, a light-emitting element is densely mounted on a substrate to increase the amount of light for a luminaire. Heat is concentrated on a part of substrate where a light-emitting element is mounted. As a result, the temperature of a light-emitting element is excessively increased. As the temperature of a light-emitting element such as an LED is increased, an output of light is decreased, and an expected lifetime is reduced. Therefore, for a luminaire using a solid light-emitting element such as a light-emitting diode (LED) or electroluminescence (EL) as a light source, it is necessary to prevent a temperature increase of a light-emitting element for increasing an expected lifetime and improving a performance such as brightness efficiency. To prevent an excessive temperature increase of a light-emitting element, various heat radiation means has been adopted. For example, a radiating structure with excellent heat conductivity is bonded to a substrate.

There is a luminaire, in which a plurality of surface-mount LED packages is mounted on a substrate. Comparing with direct mounting of a light-emitting element such as an LED on a substrate, an LED package is large as a single element, and has a large output of light. Therefore, a mounting density of LED package is low when input power per area of mounting part on a substrate is the same. In other words, the number of light-emitting points per unit area is small.

Therefore, an LED package is easy to be identified as a spotted light source during emission of light, and easy to cause uneven brightness.

When a light-emitting element is densely and directly mounted on a substrate as described above, heat is concentrated in a part of substrate where a light-emitting element is mounted, and the temperature of a light-emitting element is excessively increased. If a surface-mount LED package with the same input power is mounted on a substrate instead of a light-emitting element, it easily causes uneven brightness.

BRIEF DESCRIPTION OF THE DRAWINGS

FIG. 2 is a schematic sectional view of the light-emitting device taken along lines F2-F2 in FIG. 1;

FIG. 3 is a schematic sectional view of the light-emitting device taken along lines F3-F3 in FIG. 1;

FIG. 5 is a sectional view along a longitudinal direction of the fluorescent tube type lamp shown in FIG. 1;

FIG. 15 is a graph showing the relationship between a mean mounting density D and a temperature ° C. of the light-emitting device with one line of light-emitting elements shown in FIGS. 12A to 12C;

FIG. 16 is a graph showing the relationship between the number B of light-emitting devices per mounting part of 1 $cm^2$ and a deviation of maximum brightness % of the light-emitting device shown in FIGS. 12A to 12C.

DETAILED DESCRIPTION

In generally, according to an embodiment, there is provided a light-emitting device, which prevents concentration of heat in a mounting part of light-emitting elements on a substrate, and provides an even brightness, by mounting a light-emitting element at a suitable density.

A light-emitting device according to an embodiment includes a substrate, and a plurality of light-emitting elements mounted on the substrate. The light-emitting elements are configured to be placed to meet conditions that the number B of light-emitting elements per unit area ($cm^2$) of a mounting part is not less than 0.4 and a mean mounting density D is from not less than 58 to not greater than 334, when a relationship of the formula "D=A×B" (D equals multiplying A by B) is established, assuming D as a mean mounting density of light-emitting elements on a substrate, A as a current (mA) flowing through one light-emitting element, and B as the number of light-emitting elements per unit area (cm$^2$) of a substantial mounting part of light-emitting elements.

Figure 1:
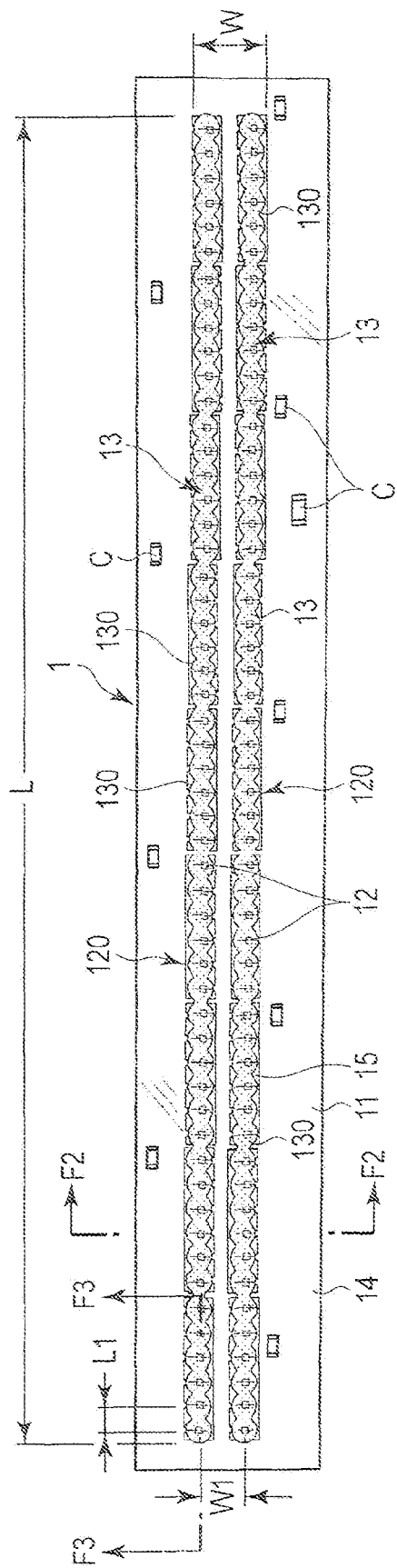
FIG. 1 is a plan view of a light-emitting device viewed from a light-emitting side according to an embodiment.
Figure 4:
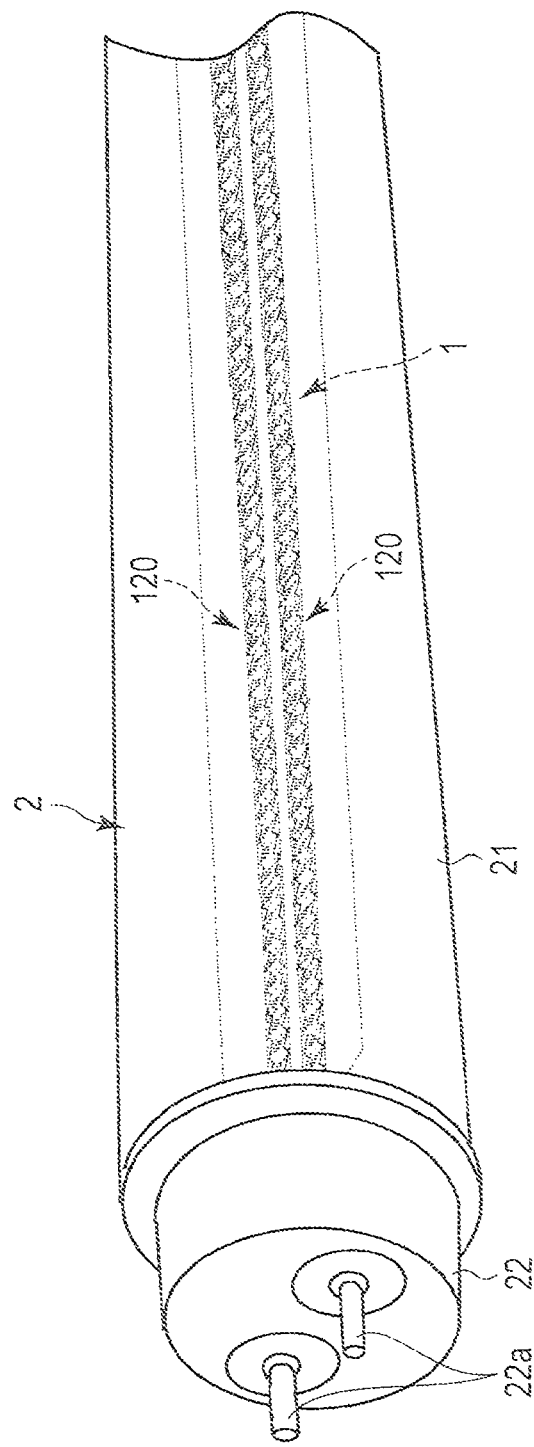
FIG. 4 is a perspective view of a fluorescent tube type lamp with the light-emitting device shown in FIG. 1.
Figure 6:
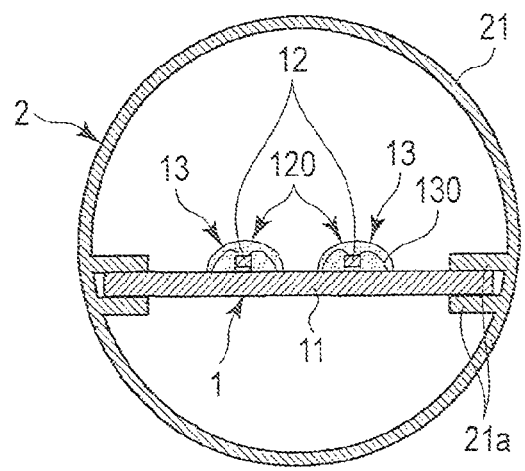
FIG. 6 is a sectional view of the lamp taken along lines F6-F6 in FIG. 5.
Figure 9:
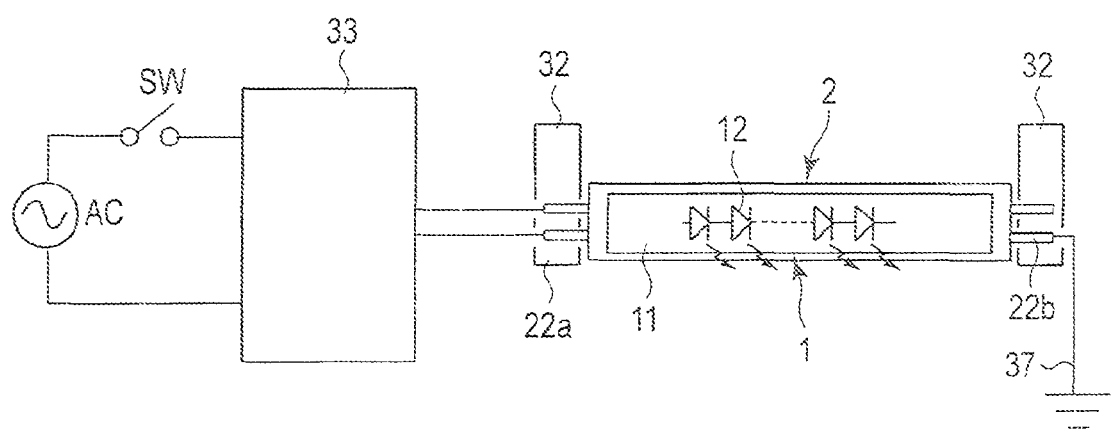
FIG. 9 is a connection diagram of the luminaire shown in FIG. 7.
Figure 7:
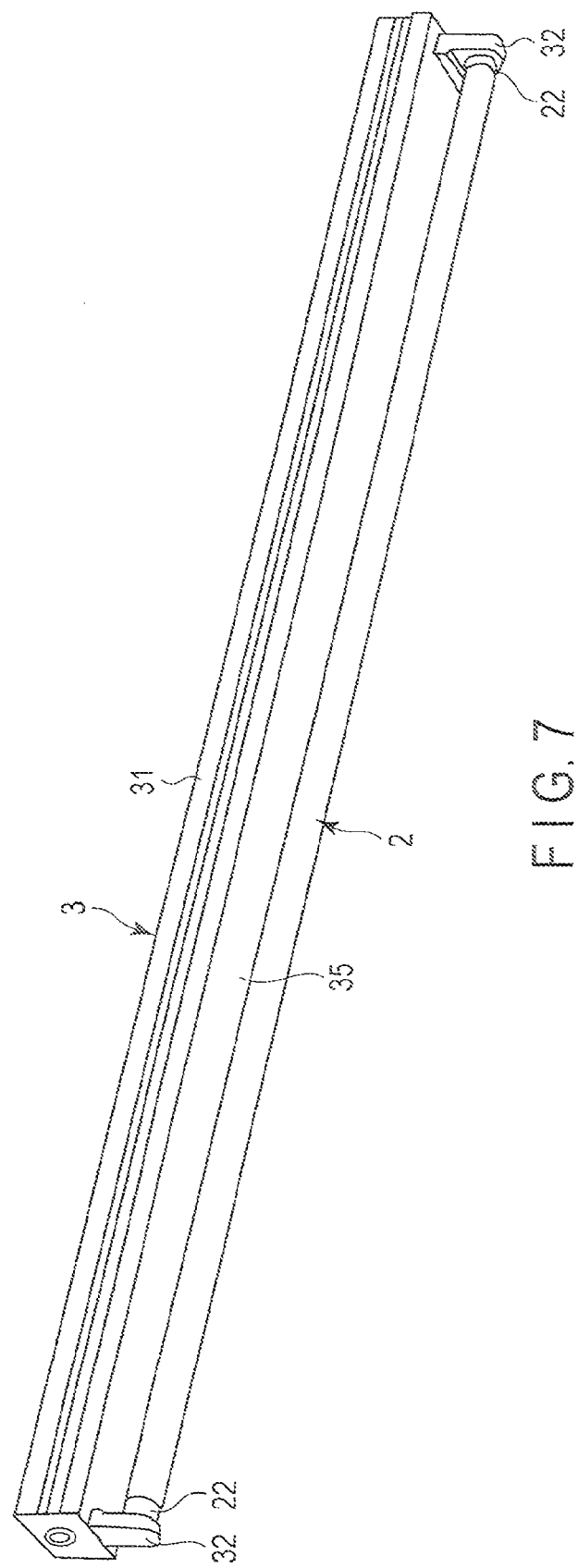
FIG. 7 is a perspective view of a luminaire provided with the lamp shown in FIG. 4.
Figure 8:
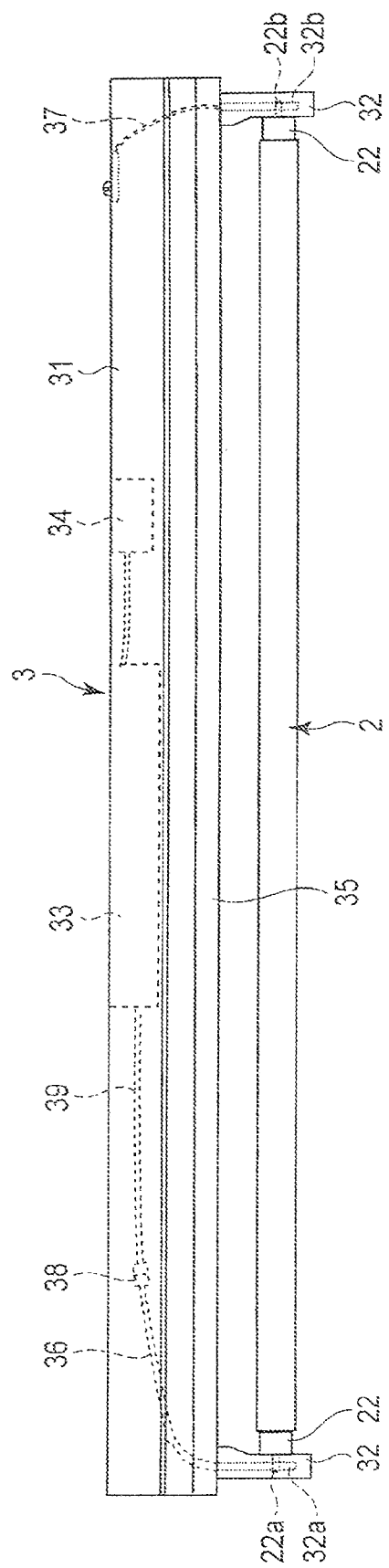
FIG. 8 is a side view of the luminaire shown in FIG. 7.

Hereinafter, an embodiment will be explained with reference to FIGS. 1 to 9. FIGS. 1 to 3 show a light-emitting device 1 of an embodiment. FIGS. 4 to 6 show a fluorescent tube type lamp 2 of an embodiment using the light-emitting device 1. FIGS. 7 to 9 show a luminaire 3 provided with the lamp 2. In each drawing, components having the same function are given the same reference numerals or symbols, and an explanation thereof is omitted.

As shown in FIG. 1, a lighting device 1 includes a substrate 11, a plurality of light-emitting elements 12, and a fluorescent layer 13 covering each light-emitting element 12. A substrate 11 is made of insulative glass epoxy resin material shaped to be a slender rectangular plate. The length of the substrate 11 is 200 mm, and the width crossing the length is 27 mm. The thickness of the substrate 11 is desirably not less than 0.5 mm and not greater than 1.8 mm, the substrate 11 having 1 mm for the thickness is adopted in the embodiment.

The shape of the substrate 11 is not limited to a rectangle. The substrate 11 having a square-shape or circular-shape may also be used. The glass epoxy (FR-4), glass composite (CEM-3), or other synthetic resin, which are relatively cheap and have a low heat conductivity, is applied to the material for substrate 11. It is permitted to use a metallic substrate with an insulating layer laminated on one side of an aluminum base plate with excellent radiation and heat conductivity for increasing the radiation function of each light-emitting element 12.

A power input port connected to a power supply, a connection terminal used for connecting a plurality of light-emitting devices 1, and a capacitor C to prevent a lighting circuit from superposing of noise which causes lighting failure of the light-emitting element 12, are mounted on the light-emitting side, where light-emitting elements 12 are mounted on, of the substrate 11 shown in FIG. 1.

As shown in FIGS. 2 and 3, a interconnect pattern 15 is formed on the lighting side of the substrate 11. The interconnect pattern 15 includes a plurality of mounting pads 15a aligned in the longitudinal direction, and a power supply conductor 15b to electrically connect the mounting pads 15a. A plurality of light-emitting elements 12 is placed on one mounting pad 15a.

The interconnect pattern 15 is constructed in three-ply. A first layer 151 is made of copper (Cu), and is formed directly on the surface of the substrate 11. A second layer 152 is made of nickel (Ni), and is formed on the first layer by an electrolytic plating. A third layer 153 is made of silver (Ag) with high reflectivity, and is formed the second layer by the electrolytic plating. The third layer 153 of the interconnect pattern 15, that is, a surface layer is plated with silver (Ag) as a reflecting layer, and the total light reflectivity is increased to 90%.

The nickel (Ni) film thickness of the second layer 152 is preferably 5 μm or more by the electrolytic plating. The silver (Ag) film thickness of the third layer 153 is 1 μm or more by the electrolytic plating. These film thickness realize uniform film thickness, and uniform reflectivity. The surface of the substrate 11 other than the layer where the interconnect pattern 15 is formed, is coated with a white resist layer 14 which has a high reflectivity as a reflecting layer, except an area to mount the light-emitting element 12 and an area to mount other components.

Each light-emitting element 12 includes an LED bare chip. A bare chip to emit blue light is used for emitting white light from the light-emitting element 12. The bare chip is bonded on the mounting pad 15a with an insulative silicone-type resin adhesive 16.

The LED bare chip is an Indium-Gallium-Nitride (InGaN) element, and is formed by laminating a light-emitting layer on a transparent sapphire element substrate. A light-emitting layer is formed by sequentially laminating an n-type nitride semiconductor layer, an InGaN light-emitting layer, and a p-type nitride semiconductor layer. An electrode to flow a current to the light-emitting layer includes a positive electrode formed by an p-type electrode pad on the p-type nitride semiconductor layer, and a negative electrode formed by an n-type electrode pad on the n-type nitride semiconductor layer. These electrodes are electrically connected to the interconnect pattern 15 with a bonding wire 17. The bonding wire 17 is made of a gold (Au) thin wire, and is connected through a bump composed mainly of gold, to increase the mounting strength and decrease damages of a LED bare chip.

A plurality of light-emitting elements 12 constitutes a plurality of light-emitting element lines 120 aligned in the longitudinal direction, two light-emitting element lines 120 are prepared in the embodiment. Each light-emitting element 12 placed as above is powered by connecting the positive side of a power input port to the mounting pad 15a, connecting the mounting pad 15a to the positive electrode of the light-emitting element 12 through the bonding wire 17, and connecting the negative electrode of the light emitting element 12 to the power supply conductor 15b through the bonding wire 17. In the embodiment, the bonding wire 17 is arranged in the direction orthogonal to the direction of the light-emitting element line 120.

A fluorescent layer 13 is made of transparent or translucent synthetic resin, transparent silicone resin in the embodiment, and contains appropriate amount of fluorescent material such as Yttrium Aluminum Garnet doped with Cerium (YAG:Ce). The fluorescent layer 13 is configured with a plurality of convex fluorescent parts 130 which forms an assembly of convex fluorescent parts 130 covering the light-emitting elements 12 respectively in the embodiment. A convex fluorescent part 130 is shaped like a dome bulged at the center, and is continued to an adjacent convex fluorescent part 130 at the base portion. The fluorescent layer 13 is formed in multiple lines, two lines in this embodiment, along the light-emitting element line 120, and covers and seals the light-emitting element 12 and bonding wire 17.

A fluorescent material is excited by the light emitted from the light-emitting element 12, and emits light of color different from the light emitted from the light-emitting element 12. As the light-emitting element 12 emits blue light in the embodiment, a yellow fluorescent material to emit yellow light that is a complementary color to blue light is used, thus the light-emitting device 1 emits white light.

A raw material of the fluorescent layer 13 is soft viscous fluid, and is cured by being heated or left in air for certain time. The fluorescent layer 13 is heaped up on the substrate 11, therefore the light-emitting element 12 and bonding wire 17 are embedded, in an uncured state. A transparent silicone resin material containing a fluorescent material, which is a raw material of the fluorescent layer 13, is dripped from a dispenser corresponding to each light-emitting element 12 and bonding wire 17, in an uncured state that the viscosity and volume are adjusted.

Thereafter, the transparent silicone resin material is cured by being heated or left in air for certain time, and becomes a fluorescent layer 13. The fluorescent layer 13 may be formed in the whole mounting part of a plurality of light-emitting elements 12, or may be formed like a line or dot along the light-emitting element line 120.

Next, the mounting density of the light-emitting elements 12 is explained. In the embodiment, the light-emitting element 12 is mounted on a substrate 11 at a preferable mounting density. A mounting density is considered as follows.

A mean mounting density can be expressed by formula "D=A×B", assuming D as a mean mounting density of the light-emitting element 12 on the substrate 11, A as a current (mA) flowing through one light-emitting element 12, and B as the number of light-emitting elements 12 per 1 cm$^2$ of substantial mounting part for a light-emitting element. Detailed explanation is omitted here, and only the conclusion is stated below. Based on the viewpoint of improving heat concentration and uneven brightness, it is preferable that the number of light-emitting elements per 1 cm$^2$ of mounting part for light-emitting elements is not less than 0.4, preferably not less than 1.5, and the mean mounting density D is from not less than 58 to not greater than 334, preferably from not less than 58 to not greater than 150.

Specifically, in the embodiment, the current A (mA) flowing through one light-emitting element 12 is 30 mA, and the number of light-emitting elements 12 per 1 cm$^2$ of substantial mounting part for light-emitting elements is 4.74. Therefore, the mean mounting density D=A (e.g. 30 mA)×B (e.g. 4.74) is 142.2, that is preferable and fit in a desirable range.

The number B of light-emitting elements 12 per 1 cm$^2$ of substantial mounting part for light-emitting elements is calculated as follows. First, as shown in FIG. 1, fifty-four light-emitting elements 12 are mounted per one line at substantially equal intervals. One substrate 11 has two lines of light-emitting element line 120, and totally one-hundred eight light-emitting elements 12 are mounted on the substrate 11. Therefore, the total number P of light-emitting elements 12 is 108. An interval L1 in light-emitting elements 12 along a light-emitting element line 120 is approximately 4 mm, and an interval W1 in light-emitting element lines is 8 mm. The total length L of a mounting part of a light-emitting element is 19 cm. The width W of a mounting part for light-emitting elements is the value (12 mm) obtained by adding the interval L1 in light-emitting elements 12 in one line to the interval W1 in light-emitting element lines.

The area S of a mounting part for light-emitting elements is W×L=22.8 cm$^2$. As the total number P of light-emitting elements 12 is divided by S, the number B of light-emitting elements 12 per 1 cm$^2$ of substantial mounting part is calculated.

A mounting part for light-emitting elements is treated as a substantial mounting part for light-emitting elements 12 when light-emitting elements 12 are mounted in a substantially equal pattern. A center value of a mounting density distribution is treated as a substantial mounting part for light-emitting elements when light-emitting elements 12 are mounted at a random or uneven density.

For example, when the light-emitting element 12 is mounted in one line, the mean mounting interval L1 of a light-emitting element is assumed to be the width W, and a rectangular area along the light-emitting element line 120 is considered to be a mounting part. When a plurality of light-emitting element lines 120 is formed, or when a plurality of groups having a high-density part and a low-density part is formed, or in the equivalent cases, such lines or groups are regarded to be a series of mounting part, unless the interval between the lines or groups exceeds ten times of the mean mounting interval L1 of light-emitting elements, and the value obtained by adding the interval W1 between the lines to the mean mounting interval L1 of light-emitting elements may be considered to be the total width W. When the interval between lines or groups exceeds ten times of the mean mounting interval L1 of light-emitting elements in each line or group, each line or group may be regarded to be one unit, and each line or group may be considered to be an individual mounting part.

In the light-emitting device 1 described above, since the mean mounting density D of the light-emitting element 12 is set to a preferable value, heat does not concentrate in a mounting part for light-emitting elements 12 on the substrate 11, and even brightness is provided. This makes it easy to use a glass epoxy substrate (FR-4) or glass composite substrate (CEM-3) which are relatively cheap and have low heat conductivity. It is also permitted to omit a radiating member to be provided on the backside of the substrate 11, on which no light-emitting element 12 is mounted, or to simplify a radiation structure including a radiating member.

The embodiment does not prevent use of a metallic base substrate with high heat conductivity, or a radiating member. Radiation performance will be improved by using these components.

Next, an explanation will be given of a fluorescent tube type lamp 2 using a light-emitting element 12 as a light source, with reference to FIGS. 4 to 6. The lamp 2 is provided with a light-emitting device 1 described above, constructed to have the same shape and dimensions as an existing straight tube fluorescent lamp, and compatible with a straight tube fluorescent lamp having the same structure. In the embodiment, the lamp has the same shape and dimensions as those of a 40-Watt straight tube fluorescent lamp.

The lamp 2 shown in FIGS. 4 and 5 has a slender bar-shaped main body 21, a light-emitting device 1, and a base 22. The main body 21 is shaped like a cylinder having an internal space, and is formed by extruding a translucent or transparent synthetic resin material. Four light-emitting devices 1, specifically, four substrates 11 are arranged inside the main body 21 on the same plane and lined on the longitudinal direction. The forming method of the main body 21 is not particularly limited. For example, the main body 21 may be formed by combining two semi-cylindrical members. As long as enough space is provided inside to install the light-emitting device 1, the main body 21 may be rectangular in the section crossing the longitudinal direction, and not limited in the shape.

In the main body 21 includes a transparent or translucent part at least forty percent, desirably seventy percent or more on the circumferential surface area. This ensures an appropriate area to oppose the area provided with light-emitting elements 12 in the light-emitting device 1 for transmitting and radiating light outward.

In FIG. 6, a pair of support projections 21a to support the base plate 11 is provided at almost the middle of the inside surface of the main body 21. The support projection 21a is shaped like a rail along the longitudinal direction of the main body 21. The support projection 21a may be partially formed by other molding methods.

The base 22 is conforming to the standard such as the G-13 type, and is configured to be fit to a socket 32 of a luminaire in which an existing straight tube fluorescent lamp is connected. The base 22 is provided at both ends of the main body 21, and has a pair of terminal pins 22a and 22b projecting from the end face. The base 22 is made of metal, but the terminal pins 22a and 22b are electrically insulated.

The terminal pins 22a illustrated on the left-hand in FIG. 9 are connected to the interconnect pattern 15 of the substrate 11, and supply power to the light-emitting device 12 when inserted into the socket 32. One of the right-hand terminal pins 22b is connected to the substrate 11 through a connecting member, and is grounded when the base 22 is inserted into the socket 32.

Either one or both of the terminal pins 22b may be grounded. Therefore, when the base 22 is connected to the socket 32, the lamp 2 is securely grounded regardless of the direction. The lamp 2 may not be structurally compatible with an existing fluorescent lamp. For example, the fluorescent tube type lamp 2 provided with the light-emitting element 12 may have an exclusive base, and the luminaire may have a socket and a lighting device applicable to the base.

Next, an explanation is given of the luminaire 3 provided with the fluorescent tube type lamp 2 shown in FIGS. 4 to 6 with reference to FIGS. 7 to 9. The luminaire 3 shown in FIGS. 7 and 8 is installed on the ceiling as a lighting apparatus. The luminaire 3 includes a slender substantially rectangular parallelepiped main body 31 made of a cold-rolled steel plate, and a lamp 2 fixed to the main body 31. The main body 31 has basically the same structure as an existing luminaire provided with a straight tube fluorescent lamp. A base 22 of the lamp 2 is fixed to a socket 32 provided at both ends.

The main body 31 is shaped like a box having a downward opening, and includes a socket 32 provided at both ends, a lighting device 33 and terminal block 34 housed in the main body 31, and a reflector 35 covering the opening.

The socket 32 is applicable to an existing straight tube fluorescent lamp, and has at least power supply terminals 32a and 32b to be connected to the terminal pins 22a and 22b of the lamp 2, as shown in FIG. 8. The power supply terminal 32a of the socket 32 illustrated in the left-hand of FIG. 8 is connected to a power supply lead wire 36 for supplying power to the light-emitting device 1 of the lamp 2. One of the power supply terminals 32b of the socket 32 illustrated in the right-hand of FIG. 8 is connected to a ground wire 37 secured to the main body 31 with a screw. As the main body 31 is electrically connected to a ground terminal of the terminal block 34, the power supply terminal 32b connected to the ground wire 37 is grounded. The other power supply terminal 32b of the socket 32 is connected to nothing.

The lighting device 33 is connected to a commercial alternating-current power supply AC as shown in FIG. 9, and converts the power obtained from the alternating-current power supply AC into a direct-current output. The lighting device 33 has a smoothing capacitor connected between the output terminals of a full-wave rectifier circuit, and has a direct-current voltage converter circuit and a current detector means connected to the smoothing capacitor respectively. A lead wire 39 is led out from the lighting device 33 as shown in FIG. 8, and is connected to the power supply terminal 32a of the socket 32 through the power supply lead wire 36 connected to a connector 38. The terminal block 34 is connected with a power supply wire and a ground wire, and is connected to the lighting device 33 shown in FIG. 8 through a lead wire.

The reflector 35 has a reflecting surface, and is fastened to the main body 31 to cover the opening. Both ends in the longitudinal direction have a notch to fit with the socket 32. As shown in the connection diagram in FIG. 9, the lighting device 33 is connected to the commercial alternating-current power supply AC, and the output of the lighting device 33 is supplied to the light-emitting element 12 of the lamp 2. In this case, the output of the lighting device 33 is supplied from the socket 32 to the substrate 11 and light-emitting element 12 through a pair of terminal pins 22a of the base 22. One of the terminal pins 22b of the base 22 not connected to the lighting device 33 is grounded through the socket 32.

In the luminaire 3 configured as described above, the light-emitting element 12 emits light, when alternating-current power is supplied to the lighting device 33, and direct-current power is supplied to the light-emitting element 12 through the lead wire 39, power supply lead wire 36, socket 32, base 22, and the substrate 11. The light emitted from the light-emitting element 12 is transmitted through the translucent (or transparent) main body 21 of the lamp 2, and radiated downward for lighting a predetermined area.

In the luminaire 3 of the embodiment, a lamp 2 structurally compatible with an existing fluorescent lamp can be used. Since the mean mounting density D of the light-emitting element 12 of the lamp 2 is set to a preferable value, heat concentration is relieved at the area on the substrate 11 where light-emitting elements 12 are mounted, and even brightness is provided.

Figure 10A:
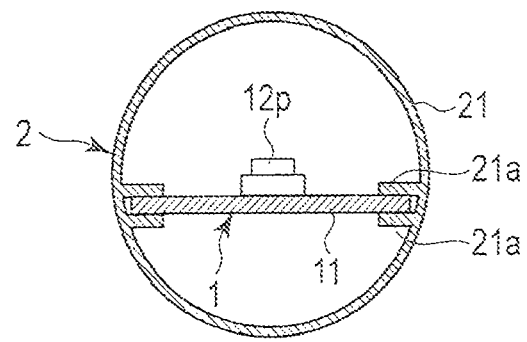
FIG. 10A is a sectional view of a lamp with a light-emitting device mounted LED packages as a comparative example, crossing a tube of the lamp.
Figure 10B:
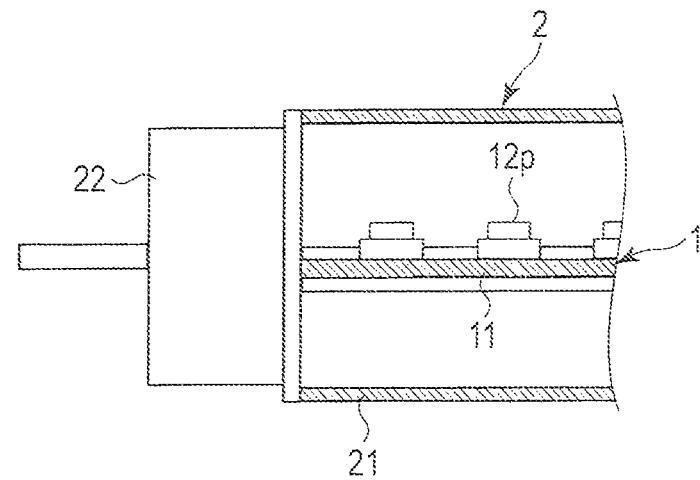
FIG. 10B is a sectional view of a lamp crossing the LED package shown in FIG. 10A.
Figure 10C:
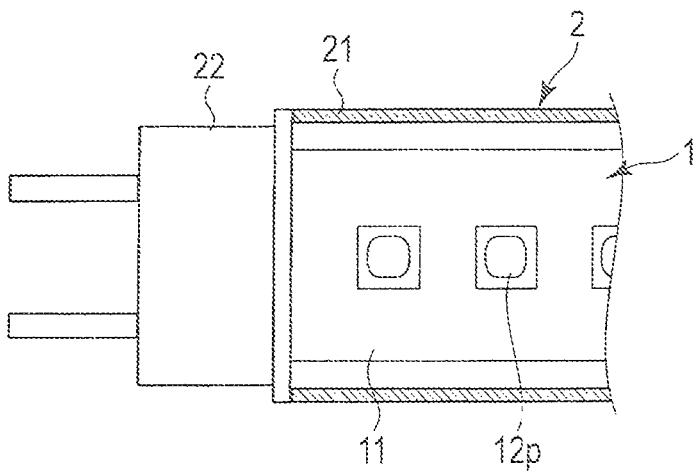
FIG. 10C is a sectional view of a lamp along a substrate shown in FIG. 10A.
Figure 11A:
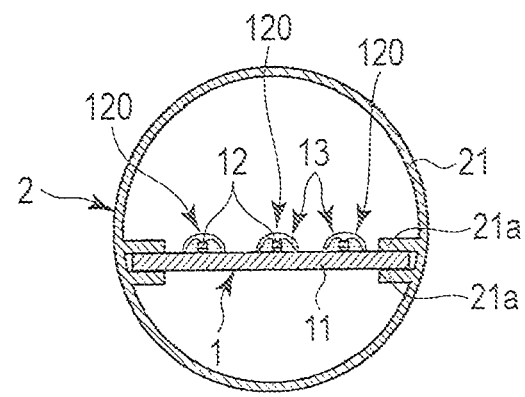
FIG. 11A is a sectional view of a lamp with a light-emitting device of an embodiment 1, crossing a tube of the lamp.
Figure 11B:
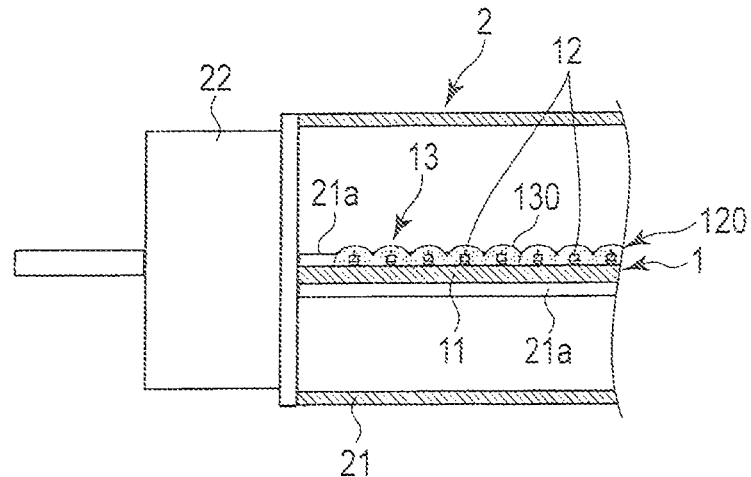
FIG. 11B is a sectional view of a lamp, crossing a light-emitting element shown in FIG. 11A.
Figure 11C:
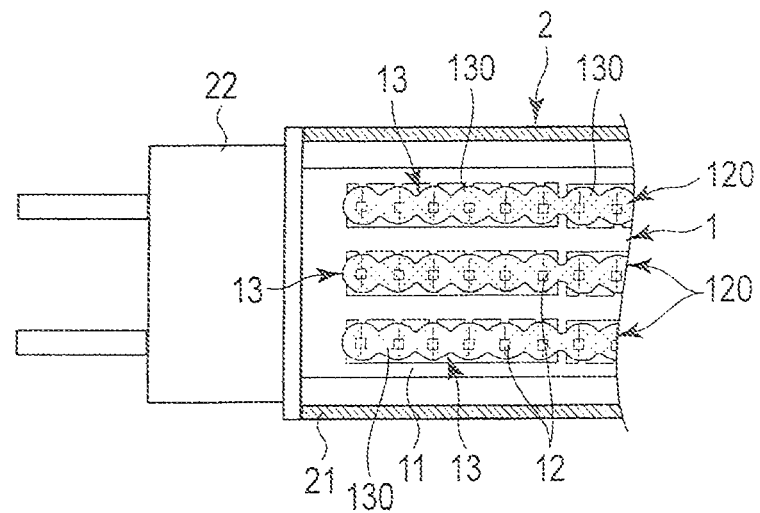
FIG. 11C is a sectional view of a lamp along a substrate shown in FIG. 11A.
Figure 12A:
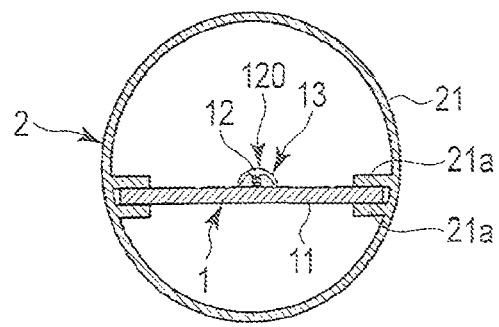
FIG. 12A is a sectional view of a lamp with a light-emitting device of an embodiment 2, crossing a tube of the lamp.
Figure 12B:
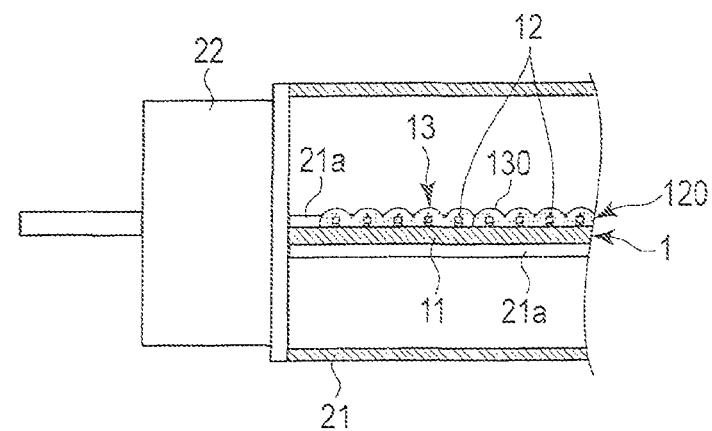
FIG. 12B is a sectional view of a lamp, crossing a light-emitting element shown in FIG. 12A.
Figure 12C:
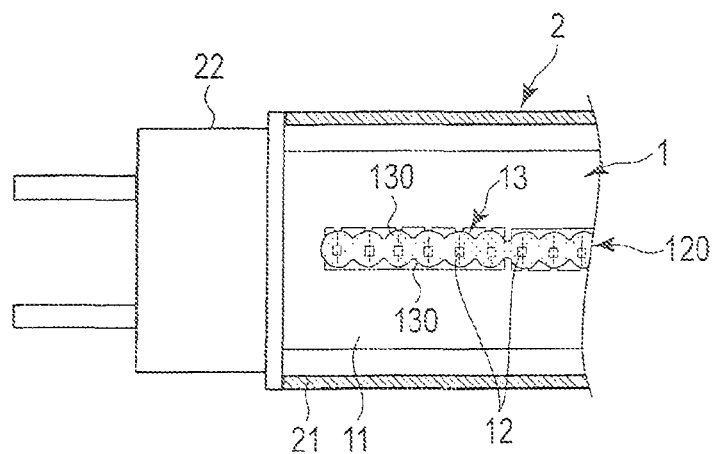
FIG. 12C is a sectional view of a lamp along a substrate shown in FIG. 12A.

In manufacturing the light-emitting device 1 of the above embodiment, the inventors have prepared various types of light-emitting device, and conducted experiments. Some results are explained with reference to FIGS. 10A to 12C. The drawings show a fluorescent tube type lamp 2 provided with a light-emitting element as a light source. FIGS. 10A to 10C show comparative examples, FIGS. 11A to 11C show an example 1, and FIGS. 12A to 12C show an example 2. FIGS. 10A, 11A and 12A are sectional views of the lamp 2 crossing the longitudinal direction. FIGS. 10B, 11B and 12B are sectional views of the end part of the lamp 2 along the longitudinal direction. FIGS. 10C, 11C and 12C are sectional views of the end part of the lamp 2 along the plane parallel to the substrate 11. In the drawings, components which has same function in the embodiment described hereinbefore are given the same numerals or symbols, and an explanation thereof is omitted.

In the lamp 2 as a comparative example shown in FIGS. 10A to 10C, a substrate 11 is a glass epoxy substrate (FR-4), which is 200 mm long and 27 mm wide. A plurality of surface-mount LED packages 12p is mounted on the substrate 11 at 10 mm intervals in the longitudinal direction. The lamp 2 has four substrates 11 arranged in the longitudinal direction in a main body 21 which has diffuseness and translucency and is formed as a cylinder with the inside diameter of 29 mm.

Each LED package is supplied with a voltage of 24-Volt, and a current of 30-milliampere. When power of these conditions is supplied to the lamp 2, the LED package 12p emits light, and increases to a maximum temperature of 100° C. A deviation of maximum brightness is thirty percent (30%), when a maximum brightness of the lamp 2 is measured along the line of the outside surface of the main body 21 of the lamp 2 crossing the plane perpendicularly to the substrate 11 at the center of the LED package 12p arranged in the longitudinal direction.

Next, in the lamp 2 of the example 1 shown in FIGS. 11A to 11C, a substrate 11 is a glass epoxy substrate (FR-4), which is 200 mm long and 27 mm wide. A plurality of light-emitting elements 12 as LED bare chips is mounted on the substrate 11 in three lines along the longitudinal direction. The interval L1 in the longitudinal direction of the light-emitting element 12 in each line is approximately 4 mm, and the interval W1 between the lines is 12 mm.

Each light-emitting element 12 is supplied with a voltage of 3-Volt, and a current of 30-milliampere. The number B of light-emitting elements per 1 $cm^2$ of a mounting part for light-emitting elements is 2.7, and the mean mounting density D is 80.4. Similar to the comparative example, the lamp 2 of the example 1 has four substrates 11 meeting the above conditions arranged in the longitudinal direction in a main body 21 which has diffuseness and translucency and is formed as a cylinder with the inside diameter of 29 mm. The input power (Watt) is the same as the comparative example.

When the power (Watt) of the same conditions as the comparative example is supplied to the lamp 2, one light-emitting element 12 increases to a maximum temperature of 70° C. while all light-emitting elements 12 are emitting light. A deviation of maximum brightness is three percent (3%), when a maximum brightness of the lamp 2 is measured along the line of the outside surface of the main body 21 of the lamp 2 crossing the plane perpendicularly to the substrate 11 at the center of the lighting element 12 arranged in the longitudinal direction.

Next, in the lamp 2 as the example 2 shown in FIGS. 12A to 12C, similar to the example 1, a substrate 11 is a glass epoxy substrate (FR-4), which is 200 mm long and 27 mm wide. A plurality of light-emitting elements 12 as LED bare chips is mounted on the substrate 11 in one line along the longitudinal direction. The interval L1 in the longitudinal direction of light-emitting elements 12 in the line is 3 mm.

Each light-emitting element 12 is supplied with a voltage of 3-Volt, and a current of 30-milliampere. The number B of light-emitting elements per 1 $cm^2$ of a mounting part for light-emitting elements is 11.1, and the mean mounting density D is 333. The lamp 2 of the example 2 has four substrates 11 meeting the above conditions arranged in the longitudinal direction in a main body 21 which has diffuseness and translucency and is formed as a cylinder with the inside diameter of 29 mm.

When the input power of the same conditions as the comparative example and the example 1 is supplied to the lamp 2, one light-emitting element 12 increases to a maximum temperature of 45° C. while all light-emitting elements 12 are emitting light. A deviation of maximum brightness is four percent (4%), when a maximum brightness of the lamp 2 is measured along the line of the outside surface of the main body 21 of the lamp 2 crossing the plane perpendicularly to the substrate 11 at the center of the light-emitting element 12 arranged in the longitudinal direction.

According to the above experimental results, the temperature of the light-emitting element 12 during lighting is lowered in the example 1 and 2 in which the light-emitting element 12 including LED bare chips is mounted at a certain mounting density D, compared with the comparative example in which LED package 12p is mounted. Further, the deviation of maximum brightness on the outside surface of the lamp 2 is lowered. Hence, uneven brightness can be decreased in the lamps 2 of the example 1 and 2.

Next, an explanation is given of a temperature (° C.) of a light-emitting element to a mean mounting density D, and a deviation of maximum brightness (%) to the number B of light-emitting elements per unit area of a mounting part, of the light-emitting device 1 including the embodiments 1 and 2 with reference to FIGS. 13 through 16.

Figure 13:
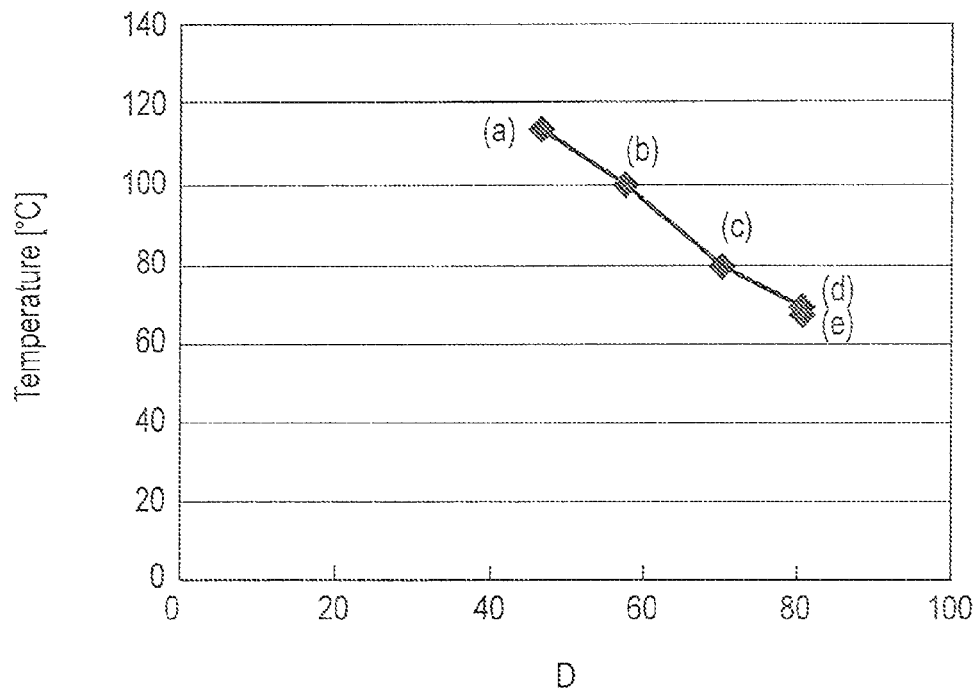
FIG. 13 is a graph showing the relationship between a mean mounting density D and a temperature ° C. of the light-emitting device with three lines of light-emitting elements shown in FIGS. 11A to 11C.
Figure 14:
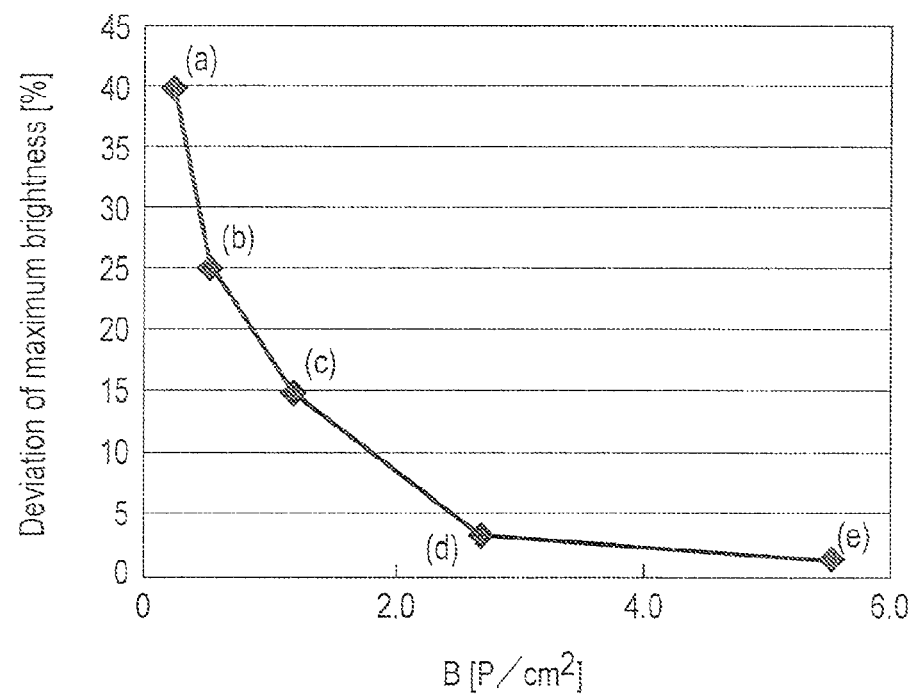
FIG. 14 is a graph showing the relationship between the number B of light-emitting devices per mounting part of 1 $cm^2$ and a deviation of maximum brightness % of the light-emitting device shown in FIGS. 11A to 11C.

First, FIGS. 13 and 14 show the result of a light-emitting device 1, in which light-emitting elements 12 are mounted in three lines, as in the example 1. Five varieties of light-emitting device 1 (a) to (e) are prepared, in which the interval between light-emitting elements 12 arranged in the direction of the light-emitting element line 120 is different. The mean mounting density D and the number B of light-emitting elements per 1 $cm^2$ of a mounting part for (a) to (e) are as follows. Actual numbers in (a) are D=46 and B=0.2, actual numbers in (b) are D=58 and B=0.5, actual numbers in (c) are D=70 and B=1.2, actual numbers in (d) are D=80 and B=2.7, and actual numbers in (e) are D=80 and B=5.5, respectively. The device (d) corresponds to the example 1. The input power (Watt) is the same in all devices (a) to (e).

In FIG. 13, a horizontal axis indicates a mean mounting density D, and a vertical axis indicates a temperature (° C.) of a light-emitting element. As shown in FIG. 13, as the mean mounting density D increases, the temperature of a light-emitting element tends to decrease. While the temperature of a light-emitting element is 115° C. in the device (a), the temperature of a light-emitting element is 68° C. in the device (e), lower than (a).

In FIG. 14, a horizontal axis indicates the number B of light-emitting elements per 1 $cm^2$ of a mounting part for light-emitting elements, and a vertical axis indicates a deviation of maximum brightness (%). As shown in FIG. 14, as the number B of light-emitting elements per 1 $cm^2$ of a mounting part for light-emitting elements increases, the deviation of maximum brightness (%) tends to decrease. Hence, in the device (a), the deviation of maximum brightness (%) is 40%, and relatively high.

FIGS. 15 and 16 show a light-emitting device 1, in which light-emitting elements is mounted in one line, as in the example 2. Similar to FIGS. 13 and 14, Five kinds of light-emitting device 1 (a) to (e) are prepared, in which the interval between light-emitting elements 12 arranged in the direction of the light-emitting element line 120 is different. The mean mounting density D and the number B of light-emitting elements per 1 $cm^2$ of a mounting part in the five light-emitting devices 1 (a) to (e) are as follows. Actual numbers in (a) are D=40 and B=0.2, actual numbers in (b) are D=66 and B=0.4, actual numbers in (c) are D=124 and B=1.6, actual numbers in (d) are D=333 and B=11.1, and actual numbers in (e) are D=663 and B=44.2, respectively. The device (d) corresponds to the example 2. The input power (Watt) is the same in the devices (a) to (e).

In FIG. 15, a horizontal axis indicates a mean mounting density D, and a vertical axis indicates a temperature (° C.) of a light-emitting element. As shown in FIG. 15, as the mean mounting density D increases, the temperature of a light-emitting element tends to decrease. In either case in FIG. 15, the temperature of a light-emitting element is not higher than 100° C.

In FIG. 16, a horizontal axis indicates the number B of light-emitting elements per 1 $cm^2$ of a mounting part for light-emitting elements, and a vertical axis indicates a deviation of maximum brightness (%). As shown in FIG. 16, as the number B of light-emitting elements per 1 $cm^2$ of a mounting part for light-emitting elements increases, the deviation of maximum brightness (%) tends to decrease. Therefore, in the device (a), the deviation of maximum brightness (%) is 55%, relatively high.

Based on the aforementioned embodiments and experimental results shown in FIGS. 13 to 16, the inventors have made observations from the viewpoint of improving heat concentration and uneven brightness, and considered the range of mean mounting density D in the light-emitting element 12, and reached an understanding that heating of a light-emitting element is prevented and uneven brightness is decreased when the number B of lighting elements per 1 $cm^2$ of a mounting part for lighting elements is not less than 0.4, preferably not less than 1.5, and the range of mean mounting density D is not less than 58 to not greater than 334, preferably not less than 58 to not greater than 150.

In addition, considering the input power (Watt) of a plurality of light-emitting elements 12, it is proved that heat concentration is effectively controlled when Ip/S is not less than 0.05 to not greater than 0.28, assuming Ip as the input power (Watt) of a plurality of light-emitting elements 12, and S as the area ($cm^2$) on the substrate 11.

In the above embodiment, the luminaire 3 has been explained as a device of the type provided with a fluorescent tube type lamp 2 containing a light-emitting device 1. A luminaire may be like a luminaire 4 shown in FIG. 17, as long as it is provided with a light-emitting device 1 meeting the above conditions.

Figure 17:
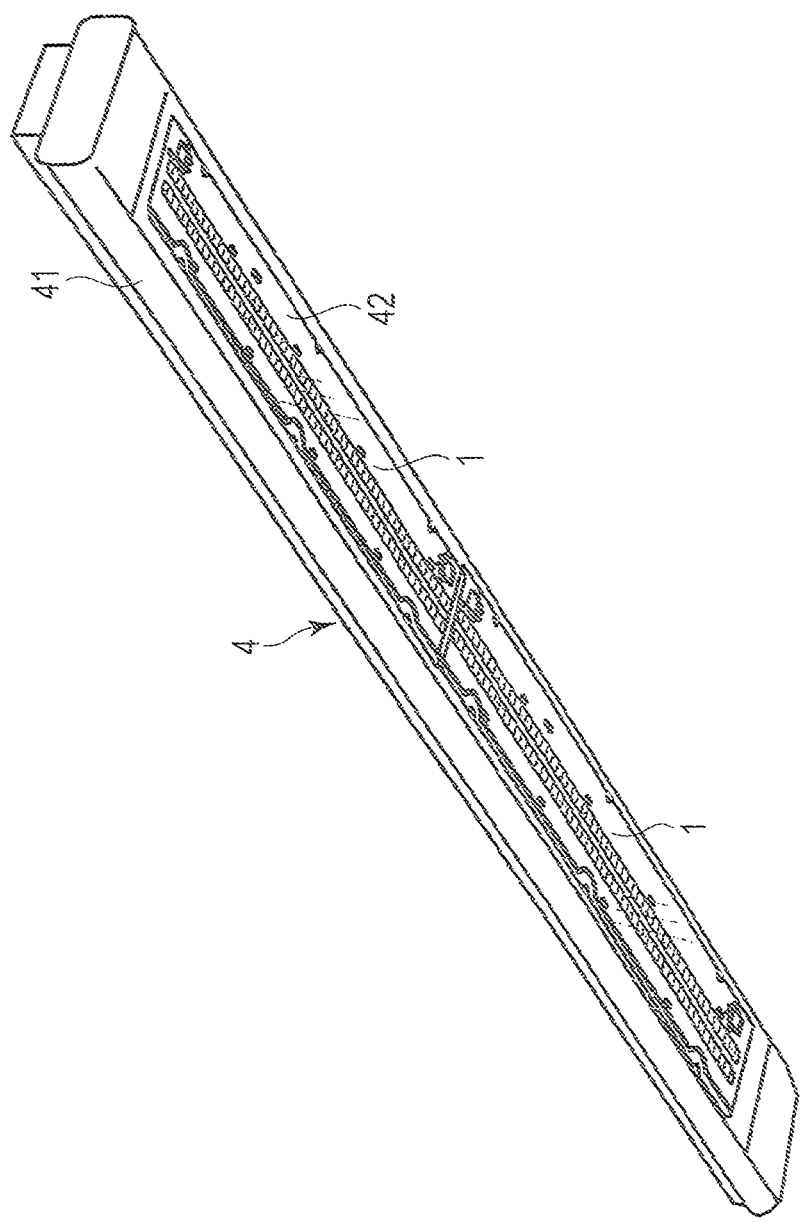
FIG. 17 is a perspective view of a modification of a luminaire according to an embodiment.

FIG. 17 shows a directly assembled luminaire 4, which is used in being directly installed on the ceiling. The luminaire 4 has a slender substantially rectangular parallelepiped case 41, which contains a plurality of light-emitting devices 1. In the luminaire 4 shown in FIG. 17, two light-emitting devices 1 are linearly arranged and connected. A power supply unit having a power supply circuit is provided in the case 41. The case 41 has a diffusive front cover 42 in an opening provided downward. The light-emitting device 1 is applicable to the luminaire 4 shown in FIG. 17, and can achieve expected effects when it is applied to the luminaire.

The embodiment may be modified in various forms without departing from its spirit or essential characters. For example, a light-emitting element means a solid light-emitting element such as an LED and organic EL. The number of light-emitting elements is not limited. Light-emitting elements to emit red, green, and blue colors, other than white, can be applied as a light-emitting element. Further, the embodiment is applicable to a lamp, lighting apparatus used indoor or outdoor, and a display, as a luminaire.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-emitting device comprising:
   a substrate; and
   a plurality of light-emitting elements mounted on the substrate,
   wherein
   the light-emitting elements are configured to be placed to meet conditions that the number B of light-emitting elements per unit area (cm$^2$) of a mounting part is not less than 0.4 and a mean mounting density D is not less than 58 to not greater than 334, when the relationship of formula "D=A×B" is established, assuming D as a mean mounting density of light-emitting elements on a substrate, A as a current (mA) flowing through one light-emitting element, and B as the number of light-emitting elements per unit area (cm$^2$) of a substantial mounting part for light-emitting elements.

2. The light-emitting device according to claim 1, wherein the light-emitting elements are configured to be placed to meet a condition that Ip/S is not less than 0.05 to not greater than 0.28, assuming Ip as the input power (Watt) of said plurality of light-emitting elements and S as an area (cm$^2$) on the substrate.

3. The light-emitting device according to claim 1, wherein the lighting-elements are configured to be placed in at least one line of light-emitting elements linearly arranged at an equal interval in adjacent light-emitting elements.

4. The light-emitting device according to claim 3, wherein the mounting part is configured to be formed to meet the following an equation, $$S=\{L1\times(P/n+1)\}\times\{L1+W1\times(n-1)\}$$

assuming L1 as an interval between the light-emitting elements, P as the total number of the light-emitting elements, n as the number of lines of light-emitting elements, W1 as an interval between the lines of light-emitting elements, and S as an area of the mounting part.

5. The light-emitting device according to claim 3, wherein adjacent lines of light-emitting elements are arranged at an interval within not greater than ten times of an interval between adjacent light-emitting elements in each line, when the light-emitting elements are arranged in at least two lines of light-emitting elements.

6. The light-emitting device according to claim 1, wherein the substrate is made of material with relatively low heat conductivity.

7. The light-emitting device according to claim 6, wherein the substrate is a glass epoxy substrate, or a glass composite substrate.

8. The light-emitting device according to claim 1, further comprising:
   a fluorescent layer configured to contain a fluorescent material which is excited by the light emitted from the light-emitting element and emit light, the fluorescent layer including a plurality of convex fluorescent parts which have a dome-shape bulged at the center and cover the light-emitting elements respectively.

9. The light-emitting device according to claim 8, wherein the convex fluorescent part is formed continuously to an adjacent convex fluorescent part at the base.

10. A luminaire comprising:
    a main body; and
    a light-emitting device configured to be placed in the main body, wherein
    the light-emitting device comprises a substrate, and a plurality of light-emitting elements mounted on the substrate, and
    the light-emitting elements are configured to be placed to meet conditions that the number B of light-emitting elements per unit area (cm$^2$) of a mounting part is not less than 0.4 and a mean mounting density D is not less than 58 to not greater than 334, when the relationship of formula "D=A×B" is established, assuming D as a mean mounting density of light-emitting elements on a substrate, A as a current (mA) flowing through one light-emitting element, and B as the number of light-emitting elements per unit area (cm$^2$) of a substantial mounting part for light-emitting elements.

11. The luminaire according to claim 10, further comprising
    a lamp configured to contain a part diffusive and translucent to the light emitted from the light-emitting element, and wherein
    the light-emitting device is contained in the lamp.

* * * * *